United States Patent [19]

Takamoto et al.

[11] Patent Number: 5,079,612
[45] Date of Patent: Jan. 7, 1992

[54] SEMICONDUCTOR INTEGRATED CIRCUIT DEVICE

[75] Inventors: Hiroshi Takamoto, Tokyo; Makoto Segawa, Yokohama, both of Japan

[73] Assignee: Kabushiki Kaisha Toshiba, Kawasaki, Japan

[21] Appl. No.: 564,615

[22] Filed: Aug. 9, 1990

[30] Foreign Application Priority Data

Aug. 11, 1989 [JP] Japan .................................. 1-209167

[51] Int. Cl.⁵ ..................... H01L 27/02; H01L 29/06; H01L 23/48; H01L 29/72
[52] U.S. Cl. .................................. 357/41; 357/23.13; 357/68; 357/34; 361/91
[58] Field of Search .................. 357/41, 23.13, 68, 34; 361/91

[56] References Cited
U.S. PATENT DOCUMENTS
4,990,802  2/1991  Smooha ............................ 357/23.13

OTHER PUBLICATIONS

J. Martin, "A New Generation of Silicon Gate CMOS Arrays", *Wescon Technical Paper*, vol. 26, Sep. 1982, pp. 7/1, 1–10.

Patent Abstracts of Japan, vol. 7, No. 236, (E–205) [1381], Oct. 20, 1983, by Itou.

*Primary Examiner*—Mark Prenty
*Attorney, Agent, or Firm*—Foley & Lardner

[57] ABSTRACT

A semiconductor IC device including a main circuit block and at least one subcircuit block, each having a ground terminal, a supply voltage terminal and an input or output terminal. A first ground line is connected to the ground terminal of the main circuit block and arranged within a wiring domain of the main circuit block and adjacent to the subcircuit blocks. A second ground line is connected to the ground terminal of the subcircuit block and arranged within a wiring domain of the subcircuit block and adjacent to the main circuit block. Protective elements are connected between the first and second ground lines so as to form short circuits through at least one of the first and second ground lines. In the IC device thus configured, all of the input and output terminals resist overvoltage, in every case where any one of the ground terminals and the supply voltage terminals is determined as a reference potential terminal, without complicating the protective element wiring arrangement or increasing the chip area and the cost thereof.

5 Claims, 12 Drawing Sheets

| INPUT/OUTPUT TER'LS  REF P TER'L | INPUT TER'L 103 | OUTPUT A TER'L 106 | OUTPUT B TER'L 109 |
|---|---|---|---|
| Vcc TER'L 101 | PROTECTIVE DEVICES 11–14 | PROTECTIVE DEVICES 12–15–14 | PROTECTIVE DEVICES 13–16–14 |
| Vss TER'L 102 | PROTECTIVE DEVICE 11 | PROTECTIVE DEVICES 12–15 | PROTECTIVE DEVICES 13–16 |
| VccoA TER'L 104 | PROTECTIVE DEVICES 11–15–17 | PROTECTIVE DEVICES 12–17 | PROTECTIVE DEVICES 13–16–15–17 |
| VssoA TER'L 105 | PROTECTIVE DEVICES 11–15 | PROTECTIVE DEVICE 12 | PROTECTIVE DEVICES 13–16–15 |
| VccoB TER'L 107 | PROTECTIVE DEVICES 11–16–18 | PROTECTIVE DEVICES 12–15–16–18 | PROTECTIVE DEVICES 13–18 |
| VssoB TER'L 108 | PROTECTIVE DEVICES 11–16 | PROTECTIVE DEVICES 12–15–16 | PROTECTIVE DEVICE 13 |

FIG. 6

SEMICONDUCTOR INTEGRATED CIRCUIT DEVICE

BACKGROUND OF THE INVENTION

The present invention relates generally to a semiconductor integrated circuit device, and more particularly to an integrated circuit device provided with elements for protecting the circuit from overvoltage.

In order to protect circuits from overvoltages such as surge voltages in a semiconductor integrated circuit device, it has been the conventional method for input terminals, output terminals, supply voltage terminals, etc. to be connected to a ground terminal via protective elements which are short-circuited in response to overvoltage to prevent overcurrent from flowing through the circuits. These protective elements are bipolar transistors, field transistors, MOS transistors, etc.

In this conventional method, however, where the circuit has two or more combinations of supply voltage terminals and corresponding ground terminals, it has been required that each input terminal and each output terminal be connected to all the ground terminals via protective elements, and furthermore for the supply voltage terminals to be connected to the ground terminals via protective elements. This is because it is necessary for all the input and output terminals to be resistant against predetermined overvoltages (referred to as ESD withstand voltages, hereinafter), in every case where any one of the ground terminals and the supply voltage terminals is determined as a reference potential terminal.

However, when each input terminal and each output terminal are connected to all the ground terminals via protective elements and furthermore all the supply voltage terminals are connected to the ground terminals via protective elements, there exists a problem in that the number of combinations of protective elements increases and therefore the chip area increases, thus resulting in a more complicated wiring arrangement and thereby a higher device cost.

SUMMARY OF THE INVENTION

With these problems in mind, therefore, it is the primary object of the present invention to provide a semiconductor integrated circuit (IC) device which can satisfy ESD withstand voltages at all the input and output terminals in every case where any one of a plurality of ground terminals and a plurality of supply voltage terminals is determined as a reference potential terminal.

Furthermore, the other object of the present invention is to provide a semiconductor integrated circuit device which can reduce the number of combinations of protective elements to be connected between two terminals, prevent the wiring arrangement from being complicated, and reduce the chip area and the cost thereof.

According to the present invention, there is provided a semiconductor integrated circuit device provided with a main circuit block and at least one subcircuit block, each having a ground terminal, a supply voltage terminal and an input or output terminal, protective elements being connected between the supply voltage terminal, the output or input terminal and the ground terminal for each circuit block, respectively to short overcurrent for circuit protection when an overvoltage is applied to each terminal, said device comprising: (a) a first ground line connected to the ground terminal of the main circuit block having a major chip area and arranged within a wiring domain of the main circuit block and adjacent to the subcircuit block; (b) a second ground line connected to the ground terminal of the subcircuit block and arranged within a wiring domain of the subcircuit block and adjacent to the main circuit block; and (c) a protective element connected between said first and second ground lines so as to form a short circuit through at least one of said first and second ground lines.

In the IC device according to the present invention, a first ground line connected to a ground terminal of the main circuit block is connected to a second ground line connected to a ground terminal of a subcircuit block via protective elements. Therefore, when overvoltage is applied to any one of the terminals, since an overcurrent flows through a short circuit via at least one of the first and second ground lines, it is possible to protect the circuit from overvoltage applied to a terminal. Furthermore, since the ground terminals are connected to each other via the first ground line, the second ground line and the protective elements, the circuits can be protected from overvoltage in every case where any one of the terminals is determined as a reference potential terminal. Here, the first ground line is arranged within a wiring domain of the main circuit block having the major chip area and adjacent to the subcircuit block, and the second ground line is arranged within a wiring domain of the subcircuit block and adjacent to the main circuit block. Since the first and second ground lines are connected via the protective elements so that at least one short circuit can be formed through at least one of the first and second ground lines, it is possible to reduce the connection distances between two terminals connected via protective elements, thus preventing complicated wiring arrangements without increasing the number of combinations of protective elements.

Furthermore, when the supply voltage line of the main circuit block is arranged within the wiring domain of the main circuit block and adjacent to the first ground line, there exists a tendency for the wiring lengths of both the first ground line and the supply voltage line to increases and therefore the wiring resistances also increases. In the present invention, however, since a plurality of protective elements are connected between the supply voltage line and the first ground line at regular intervals, it is possible to reduce the apparent wiring resistance of the short circuits formed via these protective elements and therefore securely pass overcurrent through the short circuits for providing a reliable circuit protection.

Here, where the protective element is a bipolar transistor having a well formed in a semiconductor substrate or on a semiconductor substrate surface as a base and an overvoltage is applied between two terminals, breakdown occurs to form a short circuit between the emitter and collector thereof, so that overcurrent flows to the ground terminal to protect the circuit.

As described above, in the semiconductor integrated circuit device according to the present invention, when overvoltage is applied to each terminal, since a short circuit is formed through at least one of the first ground lines arranged within a wiring range of the main circuit block occupying the major part of the chip area and adjacent to the subcircuit block or the second ground line arranged within a wiring range of the subcircuit block occupying the minor part of the chip area and adjacent to the main circuit block, the connection distances between two terminals to be connected via protective elements can be reduced; complicated wiring arrangements can be eliminated; and the number of combinations of the protective elements can be reduced.

Furthermore, when the supply voltage line of the main circuit block is arranged within the main circuit block and adjacent to the first ground line, although the wiring lengths of the supply voltage line and the first ground line tend to increase. Since the plural protective elements are connected between these two lines at regular intervals, the apparent wiring resistance of the parallel-connected short circuits formed via these protective elements can be reduced, and therefore overcurrent can reliably flow through the short circuits to protect the circuits.

BRIEF DESCRIPTION OF THE DRAWINGS

FIG. 6 is a table for assistance in explaining the routes of surge current flowing through the device;

DETAILED DESCRIPTION OF THE PREFERRED EMBODIMENTS

To facilitate understanding of the present invention, a reference will be made to a prior-art semiconductor integrated circuit device, with reference to the attached drawings.

Figure 9:
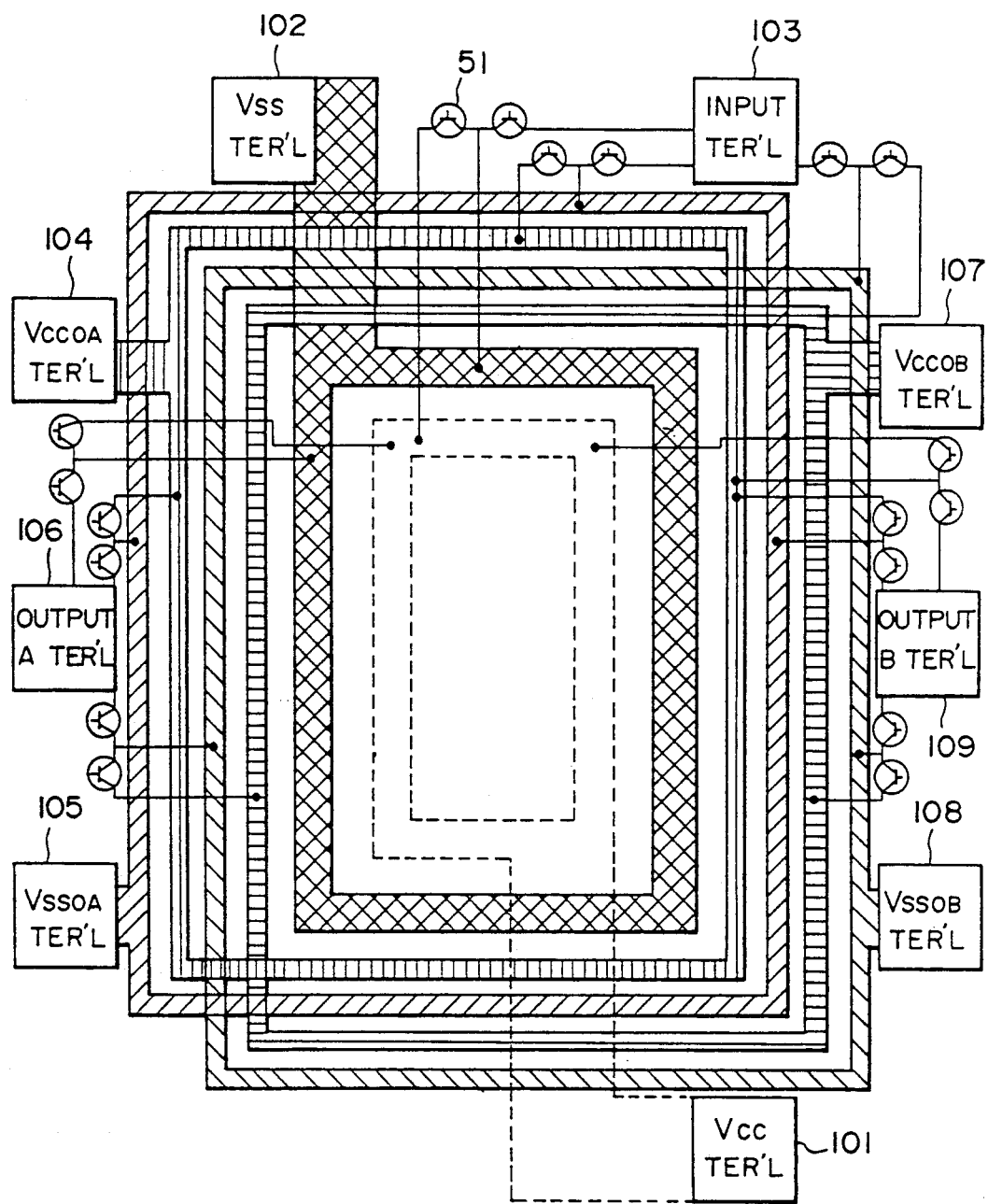
FIG. 9 is a circuit diagram showing a protective element arrangement of a prior-art semiconductor integrated circuit device.

FIG. 9 shows a protective element arrangement thereof, in which bipolar transistors 51 each having a substrate or a well as a base are incorporated as protective elements. Here, a circuit to be protected is composed of a main circuit block occupying a major part of the chip area and provided with essential circuit functions (referred to as an internal circuit block) and two subcircuit blocks occupying a minor part of the chip area and provided with interface functions, respectively (referred to as output buffer circuit block A and output buffer circuit block B). The internal circuit block includes an internal circuit supply voltage ($V_{cc}$) terminal 101, an internal circuit ground ($V_{ss}$) terminal 102, and an input terminal 103. The output buffer circuit block A includes an output buffer circuit supply voltage ($V_{CCOA}$) terminal 104, an output buffer circuit ground ($V_{SSOA}$) terminal 105 and an output A terminal 106. The output buffer circuit block B includes an output buffer circuit supply voltage ($V_{CCOB}$) terminal 107, an output buffer circuit ground ($V_{SSOB}$) terminal 108, and an output B terminal 109.

Figure 10:
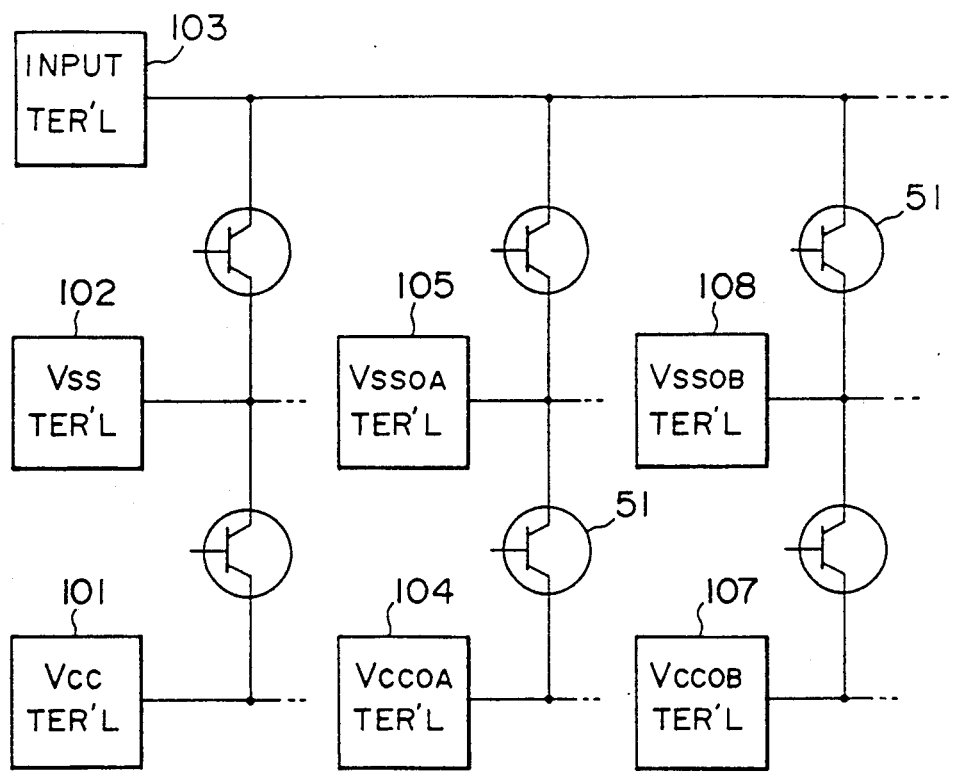
FIGS. 10 to 12 are circuit diagrams showing partial protective element arrangements of the prior-art device, respectively.
Figure 11:
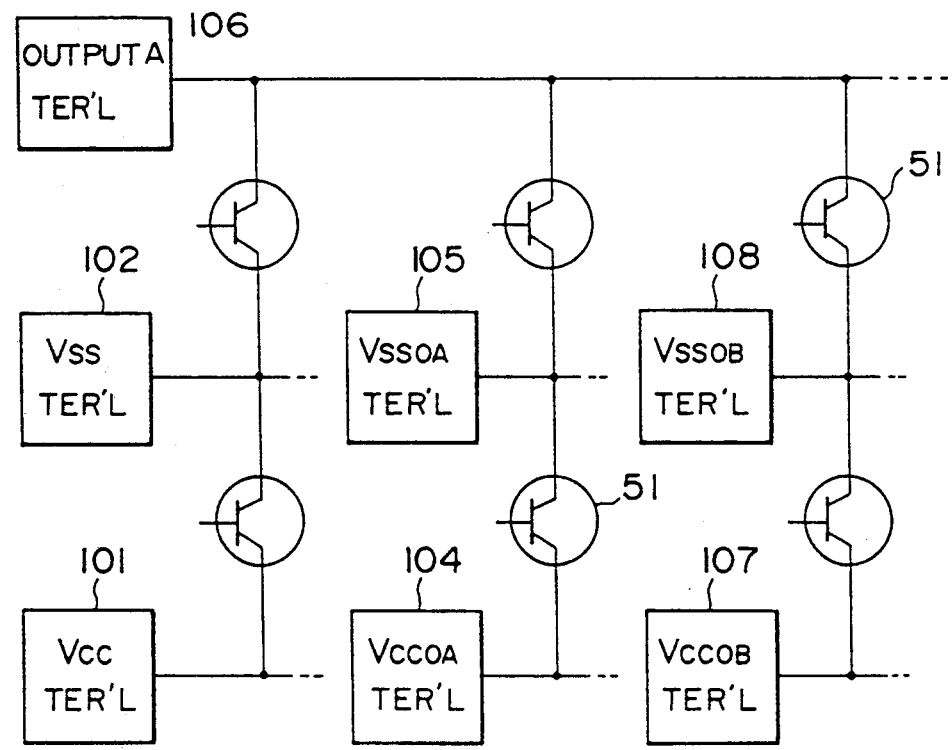
Figure 12:
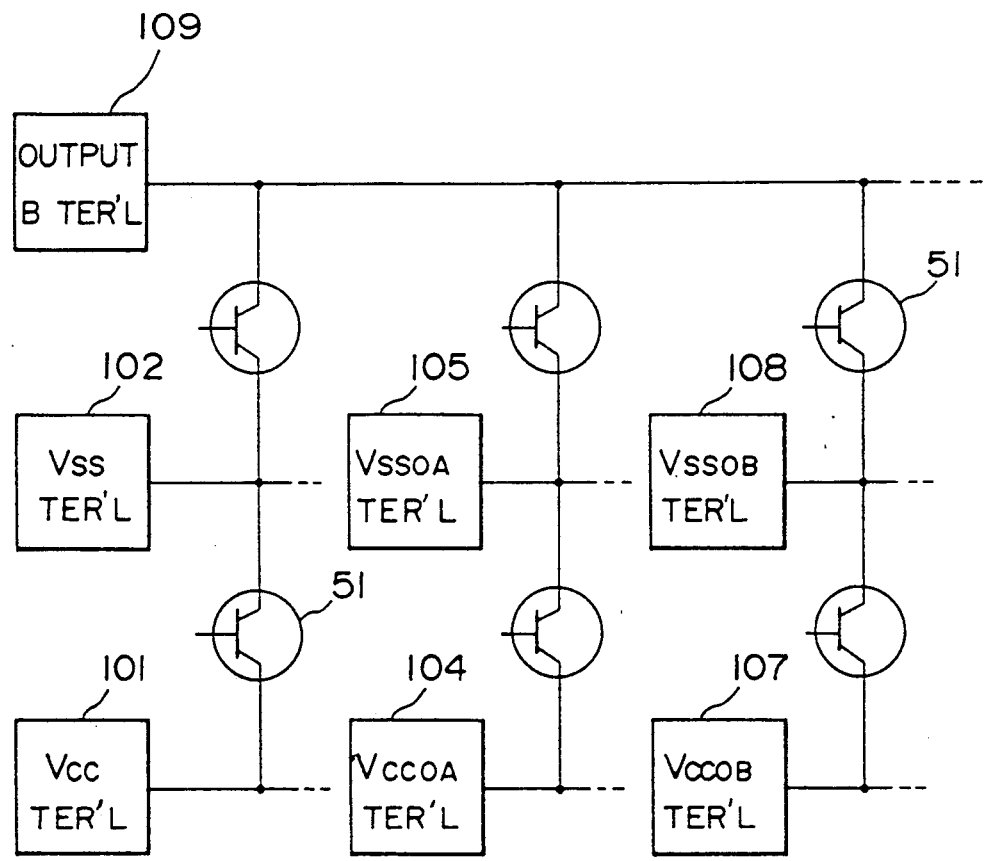

To facilitate understanding of the arrangements of the protective elements 51 each connected between two terminals, FIGS. 10, 11 and 12 show the protective element arrangements classified according to the input terminal 103, the output A terminal 106 and the output B terminal 109. In more detail, FIG. 10 shows the arrangement of the protective elements 51 connected between the input terminal 103 and the ground terminals 102, 105 and 108 and between the ground terminals 102, 105 and 108 and the supply voltage terminals 101, 104 and 107, respectively. That is, the protective elements 51 are connected between the input terminal 103 and all the ground terminals 102, 105 and 108, respectively and further between the ground terminals 102, 105 and 108 and all the corresponding supply voltage terminals 101, 104 and 107 respectively, so that this input terminal 103 is resistant against an ESD withstand voltage in every case where any one of the ground terminals and the supply voltage terminals is determined as a reference potential terminal. In the same way, FIG. 11 shows the arrangement of the protective elements 51 connected between the output A terminal 106 and the ground terminals 102, 105 and 108 and between the ground terminals 102, 105 and 108 and the supply voltage terminals 101, 104 and 107, respectively. FIG. 12 shows the arrangement of the protective elements 51 connected between the output B terminal 109 and the ground terminals 102, 105 and 108 and between the ground terminals 102, 105 and 108 and the supply voltage terminals 101, 104 and 107, respectively. In the same way as in the input terminal 103, the protective elements 51 are connected between the output A terminal 106 or the output B terminal 109 and all the ground terminals 102, 105 and 108, respectively and further between the ground terminals 102, 105 and 108 and all the corresponding supply voltage terminals 101, 104 and 107, respectively.

As described above, in the prior-art IC device, since a great number of protective elements 51 must be connected between the input or output terminal 103, 106 or 109, all the ground terminals 102, 105 and 108 and all the supply voltage terminals 101, 104 and 107 respectively, there exists a problem in that the number of combinations of the protective elements 51 is large and therefore the chip area increases, thus raising the cost thereof.

In addition, as is well understood in FIG. 9, it has been necessary to form long and complicated wiring, thus resulting in an increase in the chip area and thereby an increase in the cost thereof. In particular, the wiring is very complicated between the output buffer circuit block A and the output buffer circuit block B (each occupies a minor part of chip area), for instance between the output A terminal 106 of the output buffer circuit block A and the ground ($V_{SSOB}$) terminal 108 of the output buffer circuit block B, because the wiring distance is long therebetween.

Figure 2:
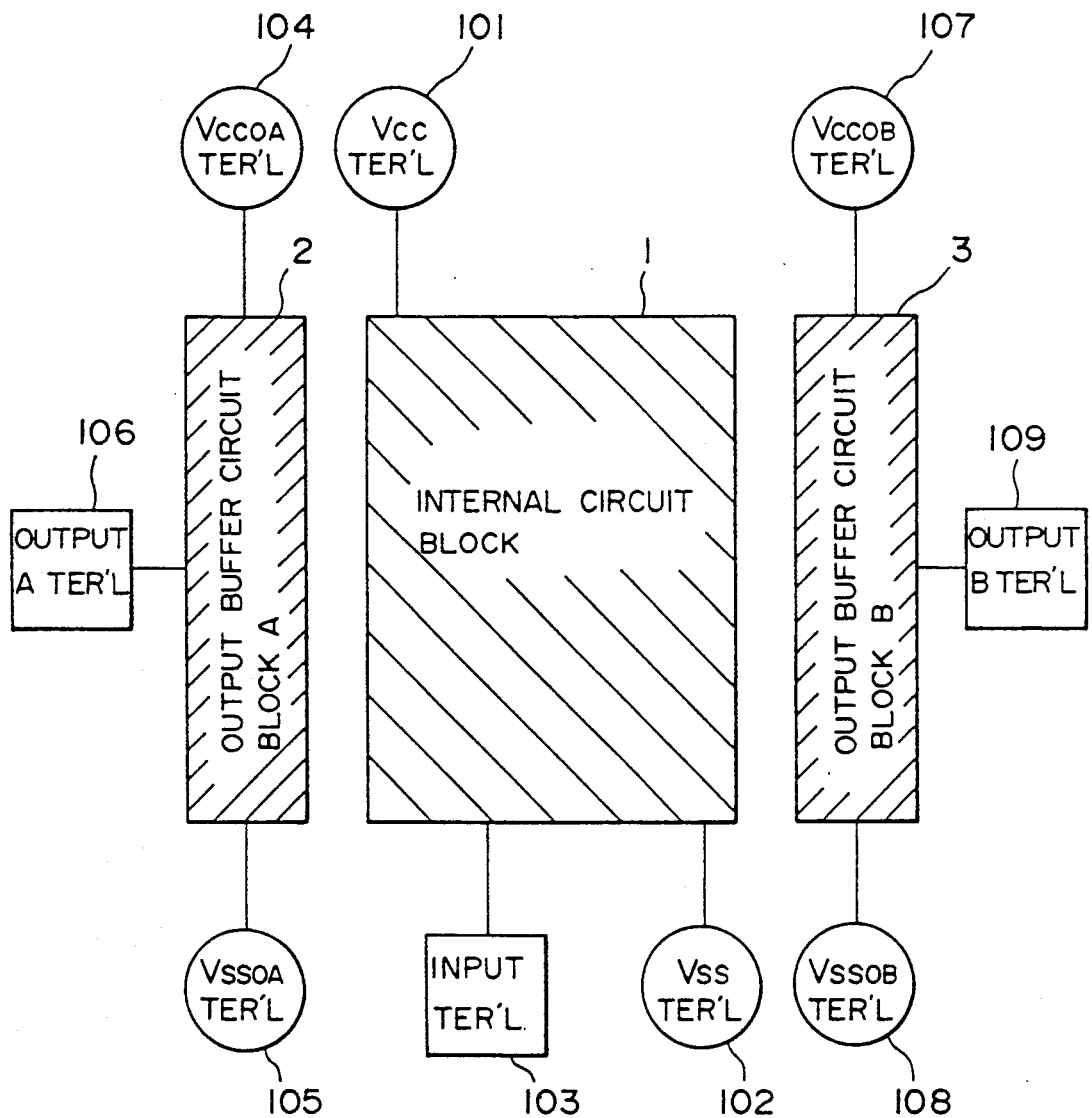
FIG. 2 is a conceptual view for assistance in explaining a block construction of the device shown in FIG. 1.

In view of the above description, reference is now made to a first embodiment of the present invention, with reference to the attached drawings. A device of the first embodiment comprises, as shown in FIG. 2, a main (internal) circuit block 1 occupying a major part of the chip area and provided with the essential circuit functions, and two subblocks of output buffer circuit block A2 and output buffer block B3 each occupying a minor part of the chip area and provided with interface functions, respectively. The internal circuit block 1 includes an internal circuit supply voltage ($V_{cc}$) terminal 101, an internal circuit ground ($V_{ss}$) terminal 102 and an input terminal 103. The output buffer circuit block A2 includes an output buffer circuit supply voltage ($V_{CCOA}$) terminal 104, an output buffer circuit ground ($V_{SSOA}$) terminal 105 and an output (A) terminal 106. The output buffer circuit block B3 includes an output buffer circuit supply voltage ($V_{CCOB}$) terminal 107, an output buffer circuit ground ($V_{SSOB}$) terminal 108, and an output (B) terminal 109.

Figure 1:
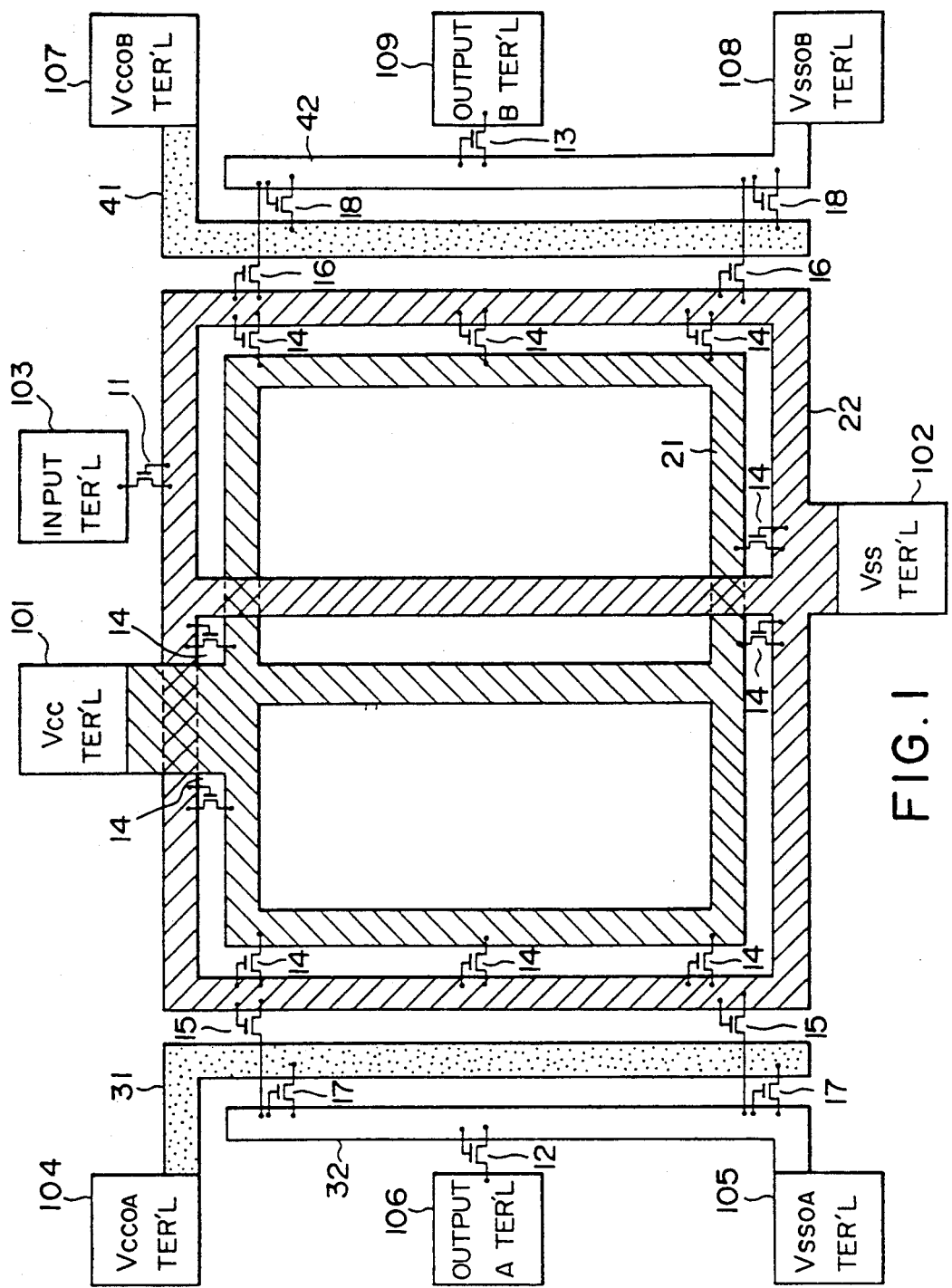
FIG. 1 is a circuit diagram showing a protective element arrangement of a first embodiment of the semiconductor integrated circuit device according to the present invention.

FIG. 1 shows a circuit diagram in which circuits to be protected are divided into three circuit blocks 1, 2 and 3 and two terminals are connected via protective elements, respectively. In more detail, a main ground line 22 connected to the ground ($V_{SS}$) terminal 102 of the internal circuit block 1 occupying the major part of the chip area is determined to be a main line; a ground line 32 connected to the ground ($V_{SSOA}$) terminal 105 and a ground line 42 connected to the ground ($V_{SSOB}$) terminal 108 are formed; protective elements 15 are connected between the main ground line 22 and the ground line 32 adjacent to the block 2 within the wiring domain of the internal circuit block 1; and protective elements 16 are connected between the main ground line 22 and the ground line 42 adjacent to the block 3 within the wiring domain of the internal circuit block 1.

Figure 3A:
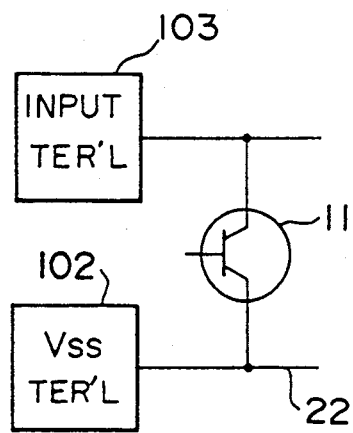
FIGS. 3A to 3G and FIGS. 4 and 5 are circuit diagrams showing partial protective element arrangements of the same device, respectively.
Figure 3B:
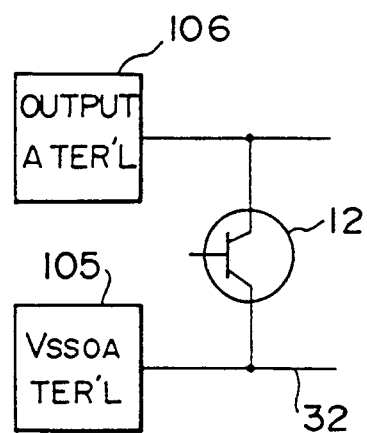
Figure 3C:
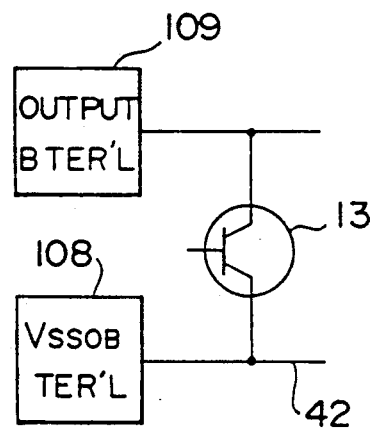
Figure 3D:
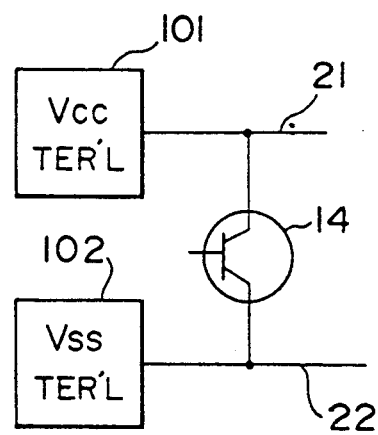
Figure 3E:
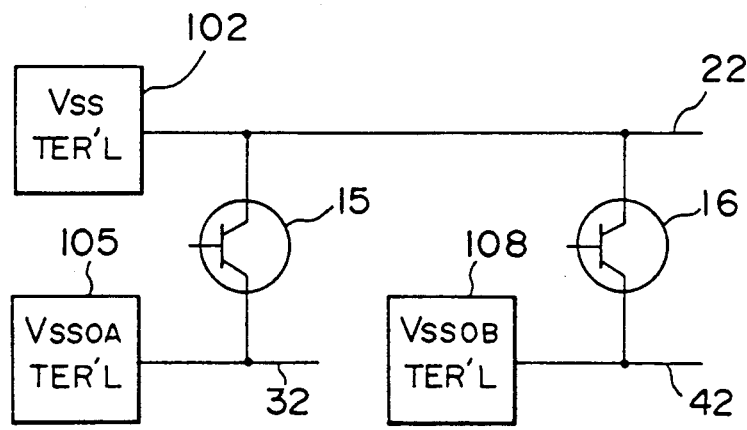
Figures 3F, 3G:
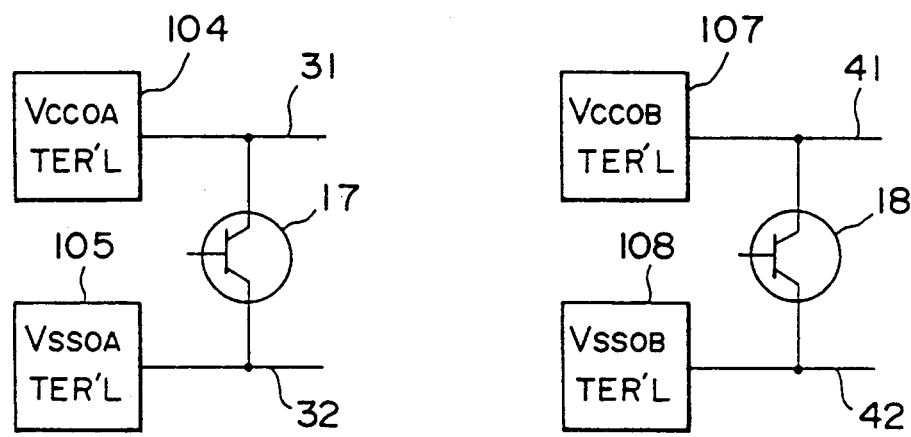

FIGS. 3A to 3G, 4 and 5 show each protective element connected between two terminals, independently. In FIG. 3A, a protective element 11 is connected between an input terminal 103 of the internal circuit block 1 and the ground line 22. In FIG. 3D, a protective element 14 is connected between the ground line 22 and a supply voltage line 21 connected to an internal supply voltage ($V_{CC}$) terminal 101. Furthermore, in FIG. 3E, each protective element 15 or 16 is connected between the ground line 22 and the ground line 32 of the circuit block 2 or the ground line 42 of the circuit block 3, respectively. In the output buffer circuit block A2, as shown in FIG. 3F, a protective element 17 is connected between the supply voltage line 31 connected to a supply voltage ($V_{CCOA}$) terminal 104 and the ground line 32 connected to the ground ($V_{SSOA}$) terminal 105, without directly connecting a protective element between the supply voltage line 31 connected to the supply voltage ($V_{CCOA}$) terminal 104 and the ground line 22. That is, a protective element 15 is connected between the ground line 32 and the ground line 22 as shown in FIG. 3E, and further a protective element 17 is connected between the supply voltage line 31 and the ground line 32 as shown in FIG. 3F, in order to indirectly connect the line 31 to the line 22 via the two protective elements 15 and 17. Furthermore, a protective element 12 is connected between the output A terminal 106 and the ground line 32 as shown in FIG. 3B.

Each protective element is connected between each terminal of the output buffer circuit block B3 and the ground line 22 connected to the internal circuit ground ($V_{SS}$) terminal 102 in the same way as in the output buffer circuit block A2. That is, in the output buffer circuit block B3, as shown in FIG. 3G, a protective element 18 is connected between the supply voltage line 41 connected to a supply voltage ($V_{CCOB}$) terminal 107 and the ground line 42 connected to the ground ($V_{SSOA}$) terminal 108. That is, a protective element 16 is connected between the ground line 42 and the ground line 22 as shown in FIG. 3E, and furthermore a protective element 18 is connected between the supply voltage line 41 and the ground line 42 as shown in FIG. 3G, in order to indirectly connect the line 41 to the line 22 via the two protective elements 16 and 18. Furthermore, a protective element 13 is connected between the output B terminal 109 and the ground line 42 as shown in FIG. 3C.

Figure 4:
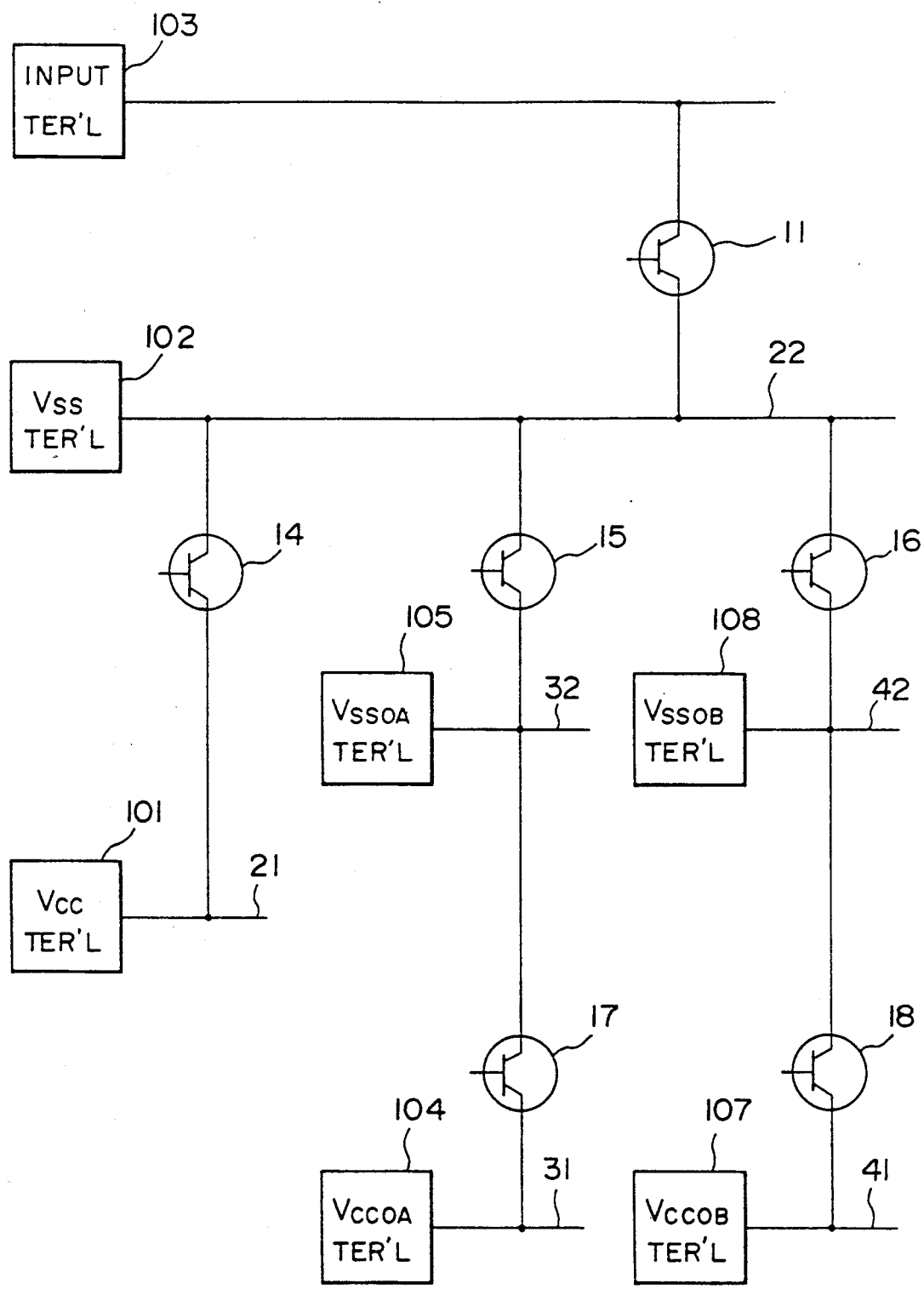
Figure 5:
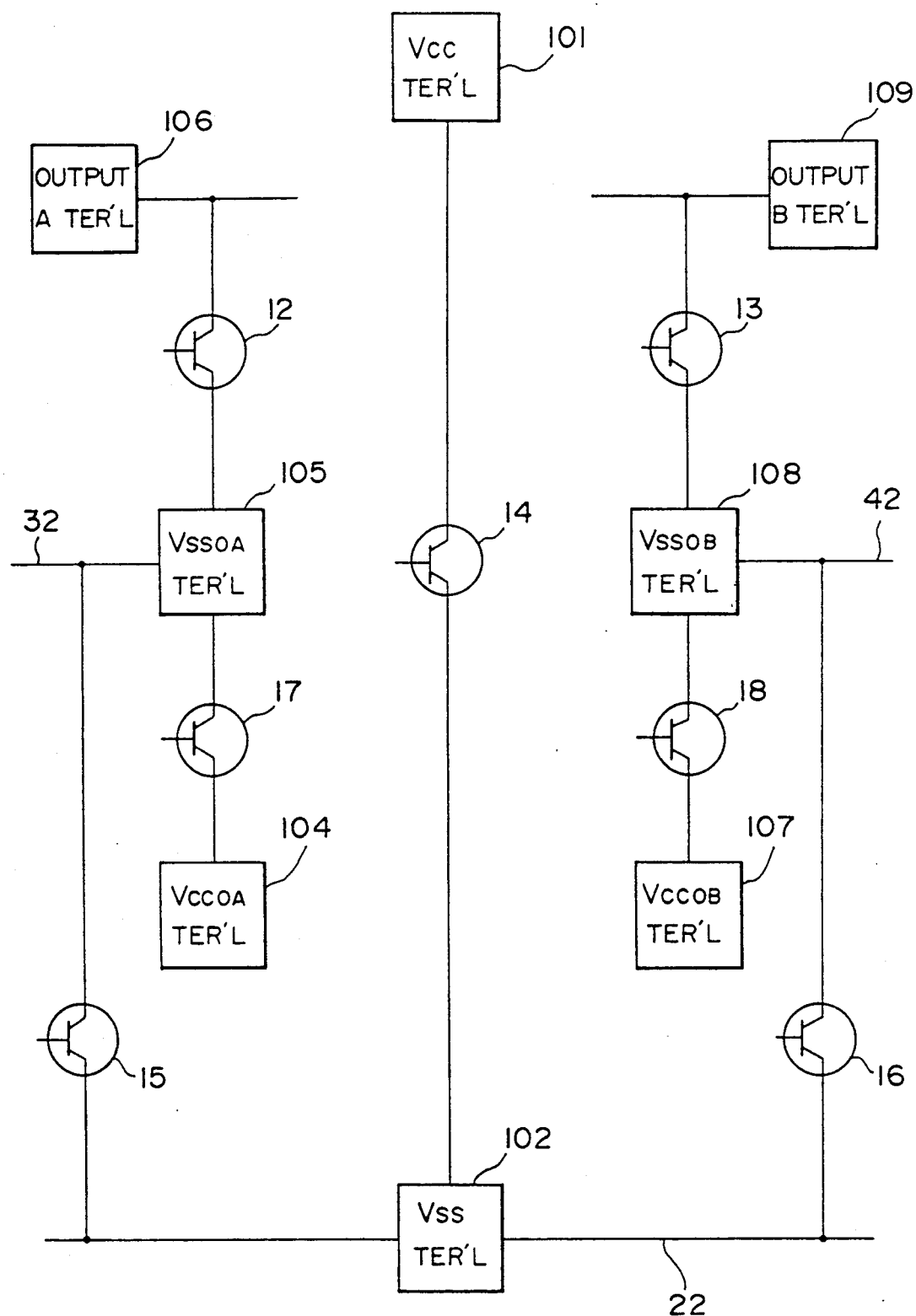

FIGS. 4 and 5 more clearly indicate that the connections between the terminals and the protective elements can be made with the ground line 22 of the internal circuit block 1 as the main line. That is, as shown in FIG. 4, a protective element 11 is connected between the ground line 22 of the internal circuit block 1 and the input terminal 103 of the same block 1, and a protective element 14 is connected between the ground line 22 and the supply voltage ($V_{CC}$) terminal 101 of the same block 1. Furthermore, a protective element 15 is connected between the ground line 22 and the ground ($V_{SSOA}$) terminal 105 of another block A2, and protective elements 15 and 17 are connected between the ground line 22 and the supply voltage ($V_{CCOA}$) terminal 104 of the block A2. The block B3 is also connected to the ground line 22 in the same way as in the block A2. Furthermore, as shown in FIG. 5, the output A terminal 106 of the block A2 is connected to the ground line 22 via two protective elements 12 and 15, and the output B terminal 109 of the block B3 is connected to the ground line 22 via two protective elements 13 and 16. Therefore, when overvoltage is applied to each terminal, overcurrent flows through routes as listed in FIG. 6. As indicated in FIG. 6, since a short circuit route through which overcurrent flows can be formed in every case where any one of the supply voltage and ground terminals is determined as a reference potential terminal, it is possible to allow the ESD withstand voltage to be satisfied at all the terminals of input terminal 103, output A terminal 106, and output B terminal 109.

As described above, the feature of the arrangement of protective elements connected between two terminals resides in the following points: the ground line 22 is formed within a wiring domain of the inner circuit block 1 which occupies the major part of the chip area and adjacent to other blocks 2 and 3 as shown in FIG. 1; two ground lines 32 and 42 for other blocks 2 and 3 are formed with the ground line 22 as the main line; and protective elements 15 and 16 are connected between the main ground line 22 and the ground line 32 or 42, respectively to form overcurrent shorting routes. As a result, it is possible to eliminate connections between two terminals arranged far away from each other beyond the wiring domains of their own blocks and extending between the output buffer circuit block A2 and the output buffer circuit block B3 both occupying the minor part of the chip area, for instance between the output A terminal 106 of the output buffer circuit block A and the ground ($V_{SSOB}$) terminal 108 of the output buffer circuit block B, thus preventing the wiring arrangement from becoming complicated and the number of combinations of the protective elements from increasing.

Furthermore, when a pattern is formed on a semiconductor substrate, since the protective elements 14 to be connected between the ground line 22 and the supply voltage line 21 in the internal circuit can be formed under these lines 21 and 22, no additional area is required other than that for the lines 21 and 22. That is, since no specific space where the protective elements 14 are formed is required, it is possible to reduce the chip area.

In the same way, since the protective elements 15 connected between the ground line 22 for the internal circuit block 1 and the ground line 32 of the output buffer circuit block A2 are located under these lines 22 and 32 and furthermore since the protective elements 16 connected between the ground line 22 and the ground line 42 for the output buffer circuit block B3 are also located under these lines 22 and 42, no specific areas are required for these protective elements 15 and 16 other than the areas required to form these lines 22, 32 and 42. Further, the protective elements 17 connected between the supply voltage line 31 and the ground line 32 in the output buffer circuit block A2 are also located under these lines 31 and 32, and the protective elements 18 connected between the supply voltage line 41 and the ground line 42 in the output buffer circuit block B3 are also located under these lines 41 and 42, thus eliminating the chip area required for these protective elements.

Figure 7:
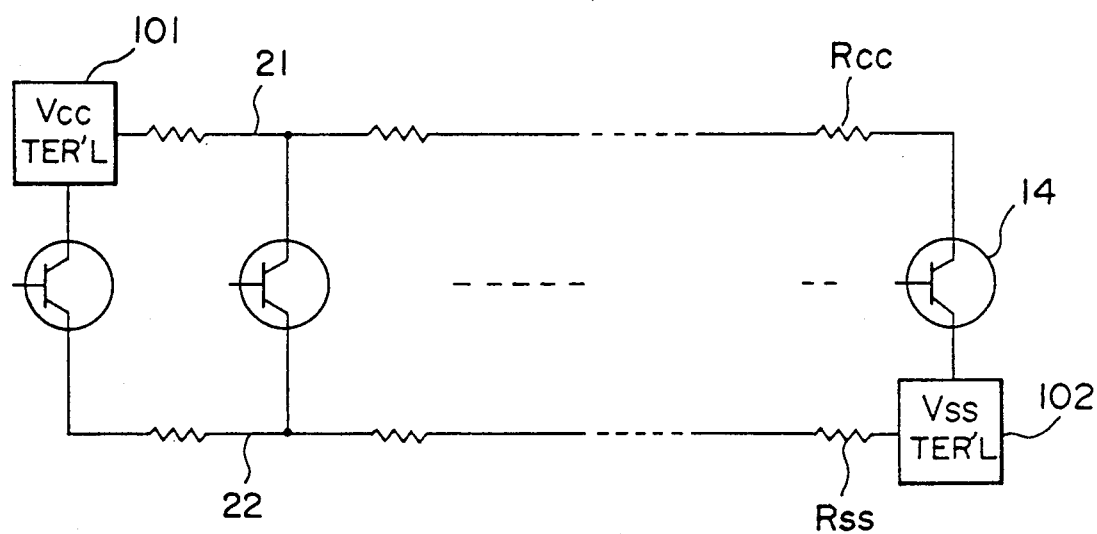
FIG. 7 is a circuit diagram showing the arrangement of protective elements connected in parallel in an internal circuit block of the device.

As is well understood in FIG. 1, since there exists such a tendency that the wiring lengths of the supply voltage line 21 and the ground line 22 increase in the inner circuit block 1, the wiring resistance Rcc of the supply voltage line 21 and the wiring resistance Rss of the ground line 22 increase, so that there exists a problem in that a large overcurrent will not flow through the short circuits formed via the protective elements 14 and therefore the circuit is damaged. To overcome the above-mentioned problem, a plurality of the protective elements 14 are connected in parallel at regular intervals between the supply voltage line 21 and the ground line 22, as shown in FIG. 7, in order to apparently reduce the wiring resistance Rss or Rcc when seen from the other protective elements, thus allowing overcurrent to flow through the protective elements for providing more reliable circuit protection from overvoltage applied to the circuit terminals.

Figure 8A:
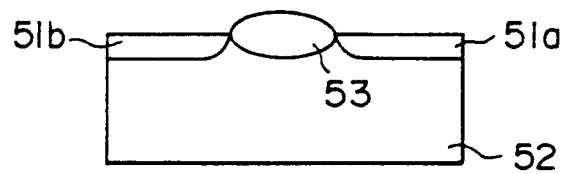
FIGS. 8A to 8C are cross-sectional views showing protective elements incorporated in the device, respectively.
Figure 8B:
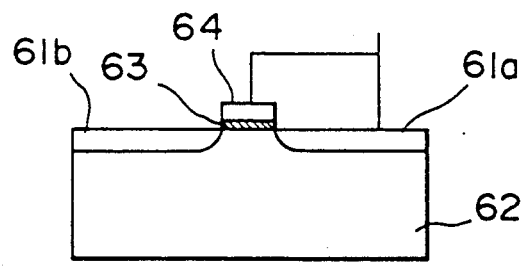
Figure 8C:
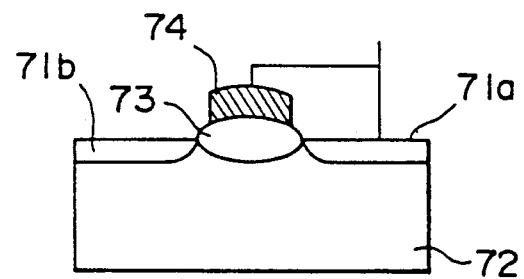

The above embodiment has been explained by way of example, and therefore the present invention is not limited to only the above embodiment. For example, the protective element of the above embodiment is a bipolar transistor with the substrate or well as a base, obtained by forming two impurity diffusion layers 51a and 51b on both sides of a field oxide film 53 on the surface of a semiconductor substrate 52 as shown by FIG. 8A. Without being limited thereto, it is also possible to adopt as the protective element a MOS transistor obtained by forming two impurity diffusion layers 61a and 61b on both sides of a gate oxide film 63 and a gate electrode 64 on the surface of the substrate 62 and by connecting the gate electrode 64 to the drain 61a as shown in FIG. 8(B) or a field transistor obtained by forming two impurity diffusion layers 71a and 71b on both sides of a field oxide film 73 and an aluminium or polycrystal silicon electrode 74 on the surface of a substrate 72 and by connecting the electrode 74 to the impurity diffusion layer 71a as shown in FIG. 8C. Furthermore, FIG. 1 shows an example of arrangements of the protective elements connected between two terminals. Without being limited thereto, it is of course possible to arrange protective elements in different ways so as to protect the circuit from overvoltage applied to the terminals.

What is claimed is:

1. A semiconductor integrated circuit device provided with a main circuit block and at least one subcircuit block, each having a ground terminal, a supply voltage terminal and an input or output terminal, protective elements being connected between the supply voltage terminal, the output or input terminal and the ground terminal for said main circuit block and for each subcircuit block, respectively to short overcurrent for circuit protection when overvoltage is applied to each terminal, said device comprising:
    (a) a first ground line connected to the ground terminal of the main circuit block having a major chip area and arranged within a wiring domain of the main circuit block and adjacent to the subcircuit block;
    (b) a second ground line connected to the ground terminal of the subcircuit block and arranged within a wiring domain of the subcircuit block and adjacent to the main circuit block; and
    (c) at least one of said protective elements connected between said first and second ground lines so as to form a short circuit through at least one of said first and second ground lines.

2. The semiconductor integrated circuit device of claim 1, which further comprises:
    (a) a supply voltage line connected to the supply voltage terminal of the main circuit block and arranged within said wiring domain of the main circuit block and adjacent to said first ground line; and
    (b) at least two protective elements connected between the supply voltage line and said first ground line and arranged at regular intervals.

3. The semiconductor integrated circuit device of claim 2, wherein said protective elements are bipolar transistors, each of which has a well formed in a semiconductor substrate or on a semiconductor substrate surface as a base.

4. The semiconductor integrated circuit device of claim 2, wherein said protective elements are MOS/field effect transistors, each of which having impurity diffusion layers on both sides of a gate oxide film and a gate electrode arranged on a well formed in a semiconductor substrate or on a semiconductor substrate surface.

5. The semiconductor integrated circuit device of claim 2, wherein said protective elements are MOS/field effect transistors, each one of which having impurity diffusion layers on both sides of a field oxide film and an aluminum or polycrystal silicon electrode arranged on a well formed in a semiconductor substrate or on a semiconductor substrate surface.

* * * * *